(12) United States Patent
Sato

(10) Patent No.: US 12,009,279 B2
(45) Date of Patent: Jun. 11, 2024

(54) SEMICONDUCTOR APPARATUS INCLUDING COOLER FOR COOLING SEMICONDUCTOR ELEMENT

(71) Applicant: FUJI ELECTRIC CO., LTD., Kawasaki (JP)

(72) Inventor: Yushi Sato, Kawasaki (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 892 days.

(21) Appl. No.: 17/039,710

(22) Filed: Sep. 30, 2020

(65) Prior Publication Data

US 2021/0050277 A1 Feb. 18, 2021

Related U.S. Application Data

(63) Continuation of application No. PCT/JP2019/035398, filed on Sep. 9, 2019.

(30) Foreign Application Priority Data

Oct. 3, 2018 (JP) .................................. 2018-188532

(51) Int. Cl.
*H01L 23/367* (2006.01)
*H01L 23/473* (2006.01)

(52) U.S. Cl.
CPC ........ *H01L 23/3677* (2013.01); *H01L 23/473* (2013.01)

(58) Field of Classification Search
CPC ........................ H01L 23/3677; H01L 23/473
(Continued)

(56) References Cited

U.S. PATENT DOCUMENTS 7,215,545 B1 * 5/2007 Moghaddam ....... H01L 23/3732
361/708
2004/0150956 A1 * 8/2004 Conte .................. H05K 7/1092
257/E23.098
(Continued)

FOREIGN PATENT DOCUMENTS

EP 2824703 A1 1/2015
JP 2010056130 A 3/2010
(Continued)

OTHER PUBLICATIONS

European Office Action dated Aug. 18, 2022, for the corresponding European patent application No. 19 869 307.9.
(Continued)

*Primary Examiner* — Eric W Jones
(74) *Attorney, Agent, or Firm* — Rabin & Berdo, P.C.

(57) ABSTRACT

A semiconductor apparatus, including an insulated substrate having a first surface and a second surface that are opposite to each other, a semiconductor element that is mounted on the first surface of the insulated substrate, and a cooler for cooling the semiconductor element. The cooler includes a heat dissipation board having a bonding surface and a heat dissipation surface that are opposite to each other, the bonding surface being bonded to the second surface of the insulated substrate, a plurality of fins provided on the heat dissipation surface of the heat dissipation board, and a cooling case having a recess accommodating the plurality of fins, an inner wall surface of the cooling case being in the recess. The heat dissipation surface is provided with a plurality of engagement pieces that position the cooling case by engaging portions of the inner wall surface of the cooling case.

9 Claims, 5 Drawing Sheets

(58) Field of Classification Search
USPC .......................................................... 257/706
See application file for complete search history.

(56) References Cited

U.S. PATENT DOCUMENTS

| | | |
|---|---|---|
| 2010/0051234 A1 | 3/2010 | Mori et al. |
| 2010/0051235 A1 | 3/2010 | Mori et al. |
| 2013/0025837 A1 | 1/2013 | Takenaga |
| 2013/0134572 A1* | 5/2013 | Lenniger ............... H01L 23/367 |
| | | 438/122 |
| 2015/0008574 A1 | 1/2015 | Gohara et al. |
| 2015/0021756 A1 | 1/2015 | Adachi |
| 2015/0102480 A1* | 4/2015 | Nakagawa .......... H01L 23/3672 |
| | | 257/714 |
| 2016/0322281 A1 | 11/2016 | Shintani et al. |

FOREIGN PATENT DOCUMENTS

| | | |
|---|---|---|
| JP | 2010056131 A | 3/2010 |
| JP | 2012243808 A | 12/2012 |
| JP | 2015159149 A | 9/2015 |
| JP | 2016051878 A | 4/2016 |
| JP | 2016092209 A | 5/2016 |
| WO | 2012169012 A1 | 12/2012 |
| WO | 2014069174 A1 | 5/2014 |
| WO | 2014125548 A1 | 8/2014 |
| WO | 2015111211 A1 | 7/2015 |

OTHER PUBLICATIONS

European Search Report issued for EP 19 869 307.9 dated Jul. 23, 2021.

* cited by examiner

SEMICONDUCTOR APPARATUS INCLUDING COOLER FOR COOLING SEMICONDUCTOR ELEMENT

CROSS-REFERENCE TO RELATED APPLICATIONS

This application is a continuation application of PCT/JP2019/035398, filed on Sep. 9, 2019, which is based upon and claims the benefit of priority of the prior Japanese Patent Application No. 2018-188532, filed on Oct. 3, 2018, the entire contents of which are incorporated herein by reference.

TECHNICAL FIELD

The present invention relates to a semiconductor apparatus that includes a cooler for cooling a semiconductor element.

BACKGROUND ART

Hybrid vehicles and electric vehicles use a power conversion apparatus to variably drive a motor. A semiconductor module (power semiconductor module) provided with a plurality of power semiconductor elements is used for the power conversion apparatus. As a general rule, a power semiconductor element generates heat when controlling a heavy current, and the amount of heat generation increases as the power conversion apparatus is downsized or becomes capable of outputting higher power.

Semiconductor apparatuses provided with a coolant-based cooler have conventionally been proposed to cool power semiconductor modules. For example, such a coolant-based cooler may include: a metal heat dissipation board bonded to the surface of an insulated substrate on the opposite side from a semiconductor module, the insulated substrate having a power semiconductor element mounted thereon; heat dissipation fins formed integrally with the heat dissipation board; and a box-shaped cooling case accommodating the fins and attached to the heat dissipation board in a liquid-tight manner. Causing a cooling medium having a pressure applied thereto by an external pump to flow through a flow passage within the cooling case releases the heat generation energy of the power semiconductor element into the cooling medium via the fins.

A semiconductor apparatus provided with a cooler such as the apparatus described above is required to have a heat dissipation board attached at an appropriate position with reference to a cooling case. A conventionally proposed semiconductor apparatus is such that a recess is provided in a portion of a cooling case having flow passages for coolant formed therein, projections to be fitted into the recess are provided on portions of a cooling fin base for forming a heat dissipation board, and the cooling fin base is attached at a proper position with reference to the cooling case (see, for example, patent document 1).

PRIOR ART DOCUMENT

Patent Document

Patent Document 1: Japanese Laid-open Patent Publication No. 2016-92209

SUMMARY OF THE INVENTION

Problems to be Solved by the Invention

However, both the cooling case and the cooling fin base in the semiconductor apparatus described in patent document 1 need to be provided with components for positioning. Thus, the semiconductor apparatus involves a problem of complicated parts for forming the apparatus.

The present invention was created in view of such facts, and an object thereof is to provide a semiconductor apparatus that allows a heat dissipation board to be positioned accurately with reference to a cooling case without need for a complicated configuration.

Means for Solving Problems

A semiconductor apparatus in accordance with embodiments includes an insulated substrate that includes a first surface and a second surface on an opposite side from the first surface, a semiconductor element that is mounted on the first surface of the insulated substrate, and a cooler for cooling the semiconductor element, wherein the cooler includes: a heat dissipation board having a bonding surface and a heat dissipation surface on an opposite side from the bonding surface, the bonding surface being bonded to the second surface of the insulated substrate; a plurality of fins provided on the heat dissipation surface of the heat dissipation board; and a cooling case having a recess accommodating the plurality of fins, and wherein the heat dissipation surface is provided with a plurality of engagement pieces for positioning that engage portions of an inner wall surface in the recess of the cooling case.

Effect of the Invention

The present invention allows a heat dissipation board to be positioned accurately with reference to a cooling case without need for a complicated configuration.

DESCRIPTION OF EMBODIMENTS

Figure 1A:
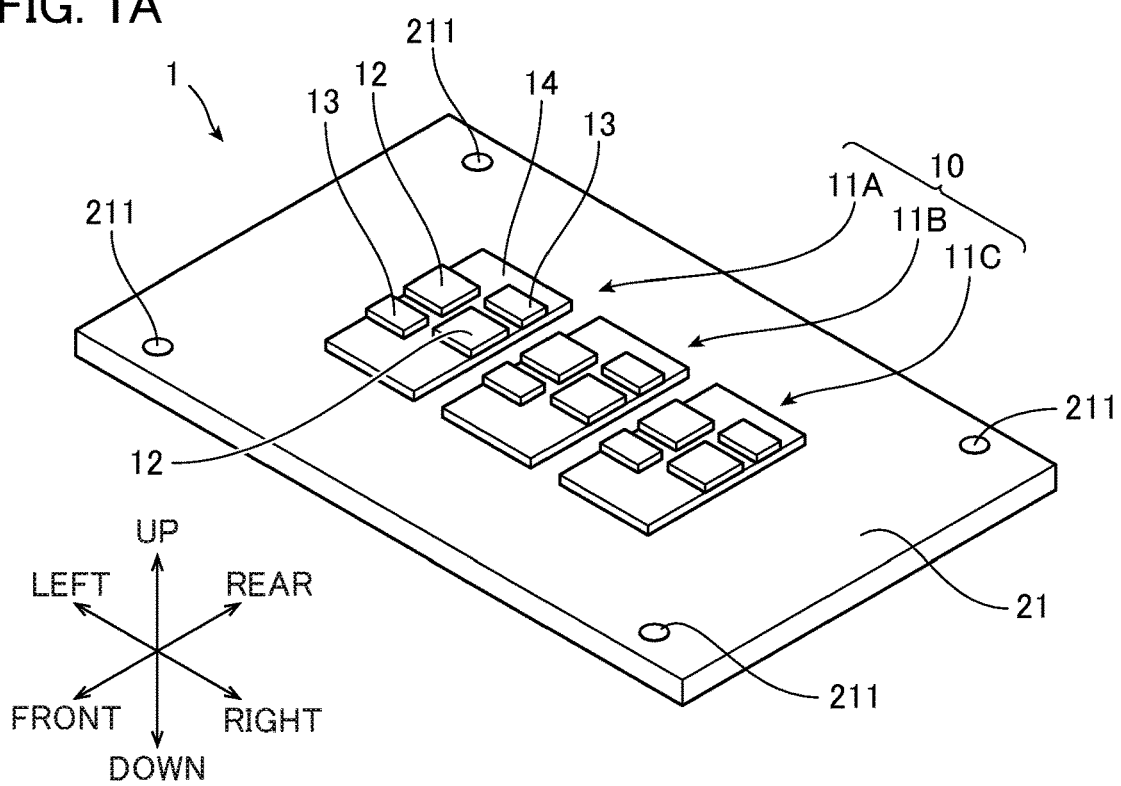
FIGS. 1A and 1B are perspective views of a semiconductor apparatus in accordance with embodiments.
Figure 1B:
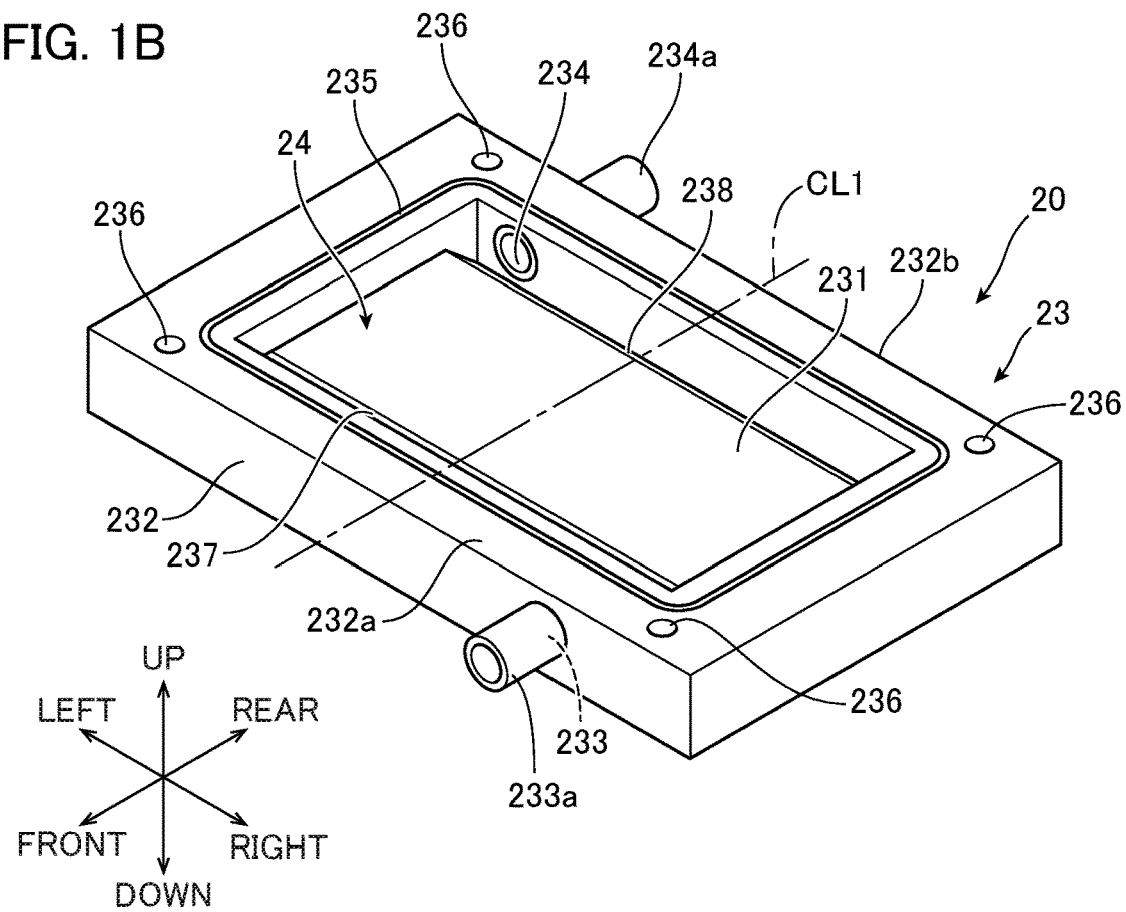
Figure 2A:
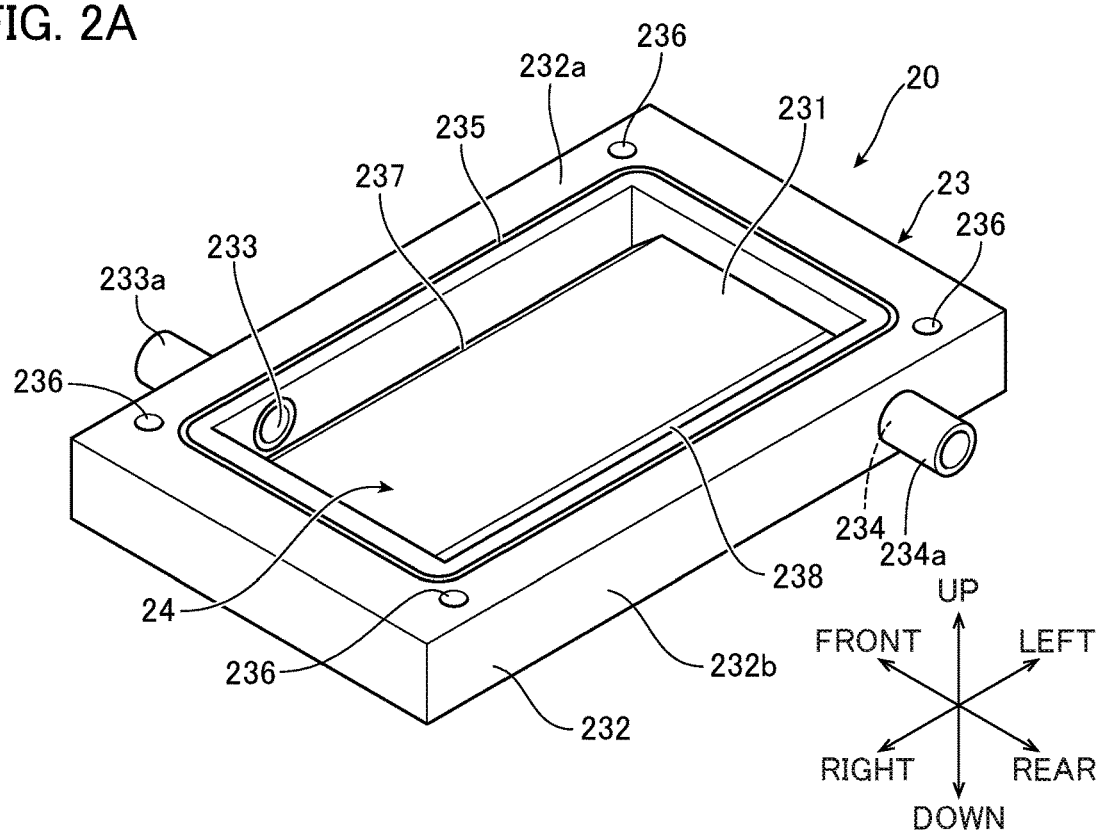
FIGS. 2A and 2B are respectively a perspective view and a plan view of a cooling case of a semiconductor apparatus in accordance with embodiments.
Figure 2B:
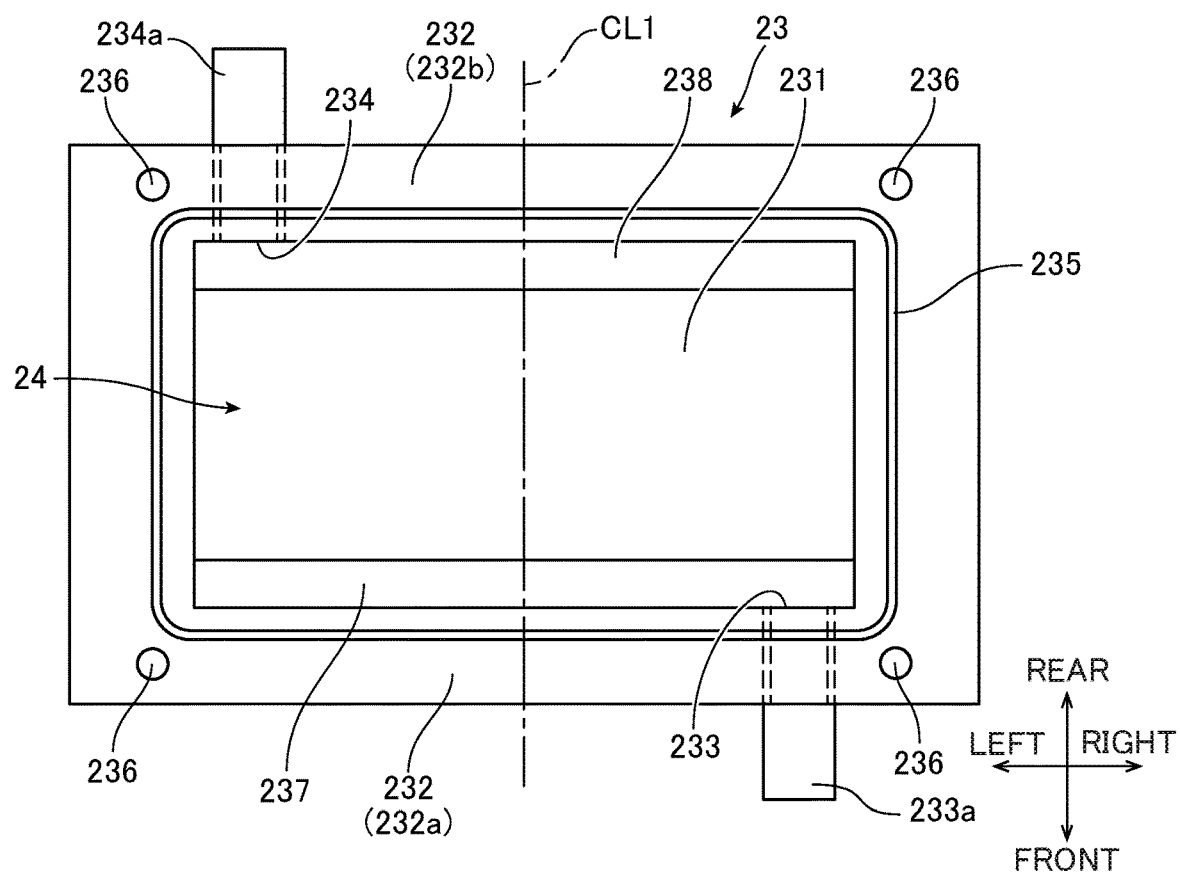

The following describes the configuration of a semiconductor apparatus in accordance with embodiments by referring to the drawings. FIGS. 1A and 1B are perspective views of a semiconductor apparatus in accordance with embodiments. FIGS. 2A and 2B are respectively a perspective view and a plan view of a cooling case of a semiconductor apparatus in accordance with embodiments. FIG. 1A depicts a heat dissipation board 21 of a semiconductor apparatus 1 in accordance with embodiments. FIG. 1B depicts a cooling case 23 to which the heat dissipation board 21 is to be attached. FIG. 2A depicts the cooling case 23 as seen in a different angle from FIG. 1B. FIG. 2B depicts the cooling case 23 as seen from above. For descriptive purposes, descriptions are given hereinafter on the assumption that the up-down direction, left-right direction, and front-rear direction indicated in FIGS. 1A and 1B are the up-down direction, left-right direction, and front-rear direction of the semiconductor apparatus. The expression "when seen in a plan view" herein means viewing the upper surface of the semiconductor apparatus from above.

As depicted in FIGS. 1A and 1B, the semiconductor apparatus 1 in accordance with embodiments includes a semiconductor module 10 and a cooler 20 that cools the semiconductor module 10. The semiconductor module 10 includes a plurality of circuit element parts 11A, 11B, and 11C disposed on a heat dissipation board 21 of the cooler 20 (descriptions are given of the heat dissipation board 21 hereinafter). The circuit element parts 11A, 11B, and 11C of the semiconductor module 10 form, for example, a three-phase inverter circuit. For example, the circuit element parts 11A, 11B, and 11C may respectively form a W-phase circuit, a V-phase circuit, and a U-phase circuit that constitute a three-phase inverter.

As depicted in FIG. 1A, the circuit element part 11A that forms a W-phase circuit includes: an IGBT element 12 serving as a semiconductor element forming an upper arm and a freewheel diode 13 connected in antiparallel to the IGBT element 12; and an IGBT element 12 forming a lower arm and a freewheel diode 13 connected in antiparallel to the IGBT element 12. Such IGBT elements 12 and freewheel diodes 13 are implemented on insulated substrates 14 bonded to the heat dissipation board 21.

The circuit element part 11B forming a V-phase circuit and the circuit element part 11C forming a U-phase circuit have a similar configuration to the circuit element part 11A. Circuit patterns for forming the abovementioned circuits are formed on the insulated substrates 14. Descriptions have been given with reference to the situation in which the semiconductor module 10 forms a three-phase inverter. However, the semiconductor module 10 in the invention is not limited to the forming of a three-phase inverter circuit and can be changed, as appropriate.

The cooler 20 includes the heat dissipation board 21 depicted in FIG. 1A, a plurality of fins 22 provided on the heat dissipation board 21 (see FIGS. 3A and 3B), and the cooling case 23 depicted in FIG. 1B. As will be described hereinafter in detail, the fins 22 are provided on the surface of the heat dissipation board 21 (heat dissipation surface) opposite from the surface to which the insulated substrates 14 are bonded (bonding surface). The heat dissipation board 21 is attached to an upper portion of the cooling case 23. The plurality of fins 22 provided on the lower surface of the heat dissipation board 21 (heat dissipation surface) are accommodated in a recess 24 formed in the cooling case 23. The cooling case 23 may be referred to as a coolant jacket or a water jacket.

The heat dissipation board 21 is formed from a metal plate having a generally rectangular shape as depicted in FIG. 1A. For example, the heat dissipation board 21 may be formed from a metal material such as aluminum, copper, or iron. The longer length direction of the heat dissipation board 21 extends in the left-right direction of the semiconductor apparatus 1, and the shorter length direction thereof extends in the front-rear direction of the semiconductor apparatus 1. The semiconductor module 10 is disposed within a central region on the upper surface of the heat dissipation board 21. In embodiments, the circuit element parts 11A, 11B, and 11C that form the semiconductor module 10 are arranged in the left-right direction within the central region on the heat dissipation board 21. Screw holes 211 are formed through the vicinities of four corners of the heat dissipation board 21. Screws (fastening members) for fixing the heat dissipation board 21 to the cooling case 23 are inserted into the screw holes 211.

As depicted in FIGS. 1B and 2, the cooling case 23 has an essentially rectangular-solid external shape and is shaped like a rectangle when seen in a plan view. When seen in a plan view, the external shape of the cooling case 23 is substantially the same as that of the heat dissipation board 21. The cooling case 23 includes a bottom wall 231 and side walls 232 provided on outer edges of the bottom wall 231 and is shaped like a box having an opening in an upper portion thereof. In other words, the recess 24 is formed in the upper surface of the cooling case 23. The recess 24 is defined by an upper surface of the bottom wall 231, inner wall surfaces of the side walls 232, and upper surfaces (inclined surfaces) of a diffusion wall 237 and a convergence wall 238 (descriptions are given of these walls hereinafter). When seen in a plan view, the recess 24 is shaped like a rectangle having a longer length direction extending in the left-right direction of the semiconductor apparatus 1 (see FIG. 2B).

The cooling case 23 is provided with an introduction port 233 for introducing a cooling medium into the cooling case 23 and a discharge port 234 for discharging the cooling medium from the cooling case 23. The introduction port 233 and the discharge port 234 are respectively provided on portions of a first side wall 232a and a second side wall 232b both extending in the longer length direction. The introduction port 233 is located in the vicinity of one end portion of the first side wall 232a (right-side end portion depicted in FIGS. 1A and 1B) and in communication with the recess 24. The discharge port 234 is located in the vicinity of another end portion of the second side wall 232b (left-side end portion depicted in FIGS. 1A and 1B) and in communication with the recess 24. The introduction port 233 and the discharge port 234 are located at positions spaced apart in opposite directions from a center line CL1 of the recess 24 with reference to the longer length direction. An introduction tube 233a and a discharge tube 234a are respectively connected to the introduction port 233 and the discharge port 234.

An O ring 235 is attached to the upper surfaces of the side walls 232. The O ring 235 is disposed at positions on the side walls 232 close to the recess 24 and surrounds the recess 24. When the heat dissipation board 21 is attached to the cooling case 23 and a cooling medium flows within the cooling case 23, the O ring 235 serves to prevent liquid leakage from within the cooling case 23. The component for prevention of liquid leakage is not limited to the O ring 235 and may be a metal gasket or a liquid packing.

Screw holes 236 are formed in the vicinities of four corners of the cooling case 23 (side walls 232). The screw holes 236 are located at positions that correspond to the screw holes 211 of the heat dissipation board 21 when the heat dissipation board 21 is placed over the cooling case 23. While the heat dissipation board 21 is placed over the cooling case 23, screws (fastening members) are inserted through the screw holes 211 into the screw holes 236 for fastening so as to attach the heat dissipation board 21 to the cooling case 23.

The diffusion wall 237 is provided within the recess 24 of the cooling case 23 in such a manner as to be sandwiched between the bottom wall 231 and the first side wall 232a. The convergence wall 238 is also provided within the recess 24 of the cooling case 23 in such a manner as to be sandwiched between the bottom wall 231 and the second side wall 232b. The diffusion wall 237 is located on the front side of the bottom wall 231 and connected to a front edge portion of the bottom wall 231. The convergence wall 238 is located on the rear side of the bottom wall 231 and connected to a rear edge portion of the bottom wall 231. The diffusion wall 237 and the convergence wall 238 extend in the longer length direction of the semiconductor apparatus 1. The diffusion wall 237 is formed from an inclined surface and serves to diffuse a cooling medium introduced through the introduction port 233 along the first side wall 232a. The convergence wall 238 is formed from an inclined surface and serves to converge the cooling medium within the cooling case 23 along the second side wall 232b into the discharge port 234.

Figure 3A:
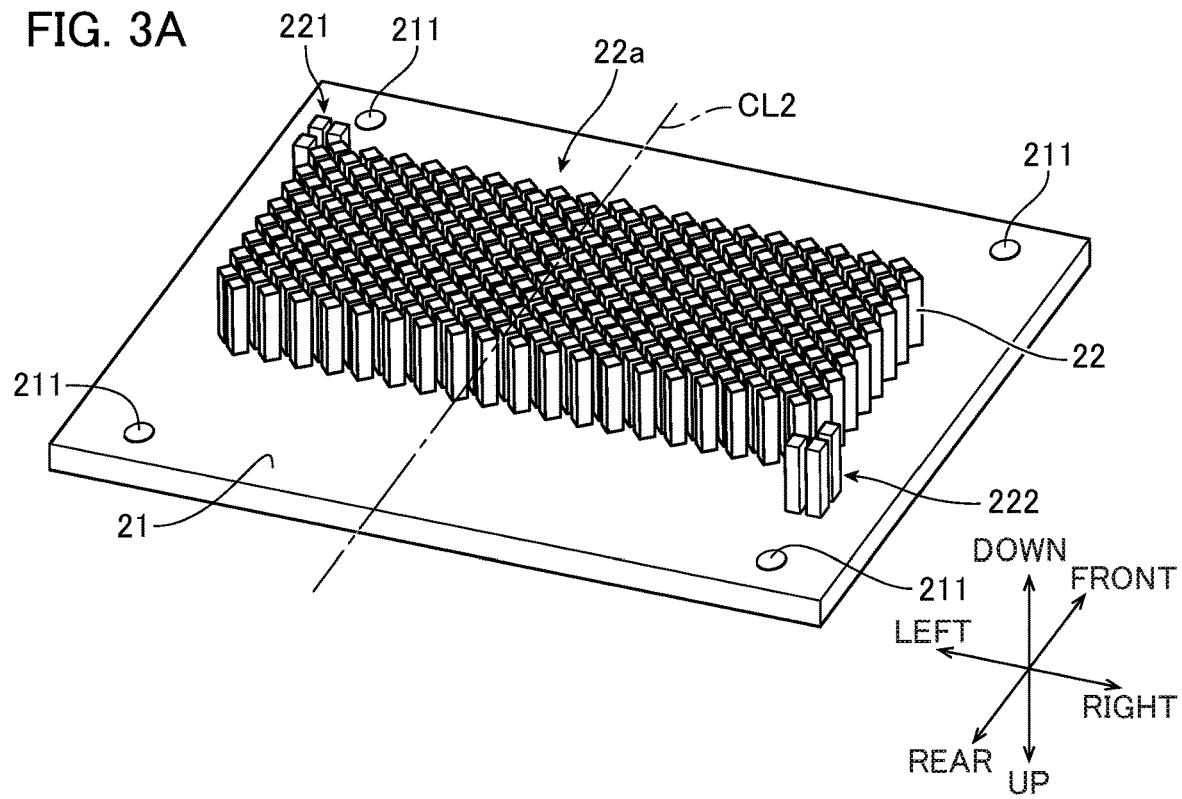
FIGS. 3A and 3B are explanatory diagrams of fins provided on a heat dissipation board of a semiconductor apparatus in accordance with embodiments.
Figure 3B:
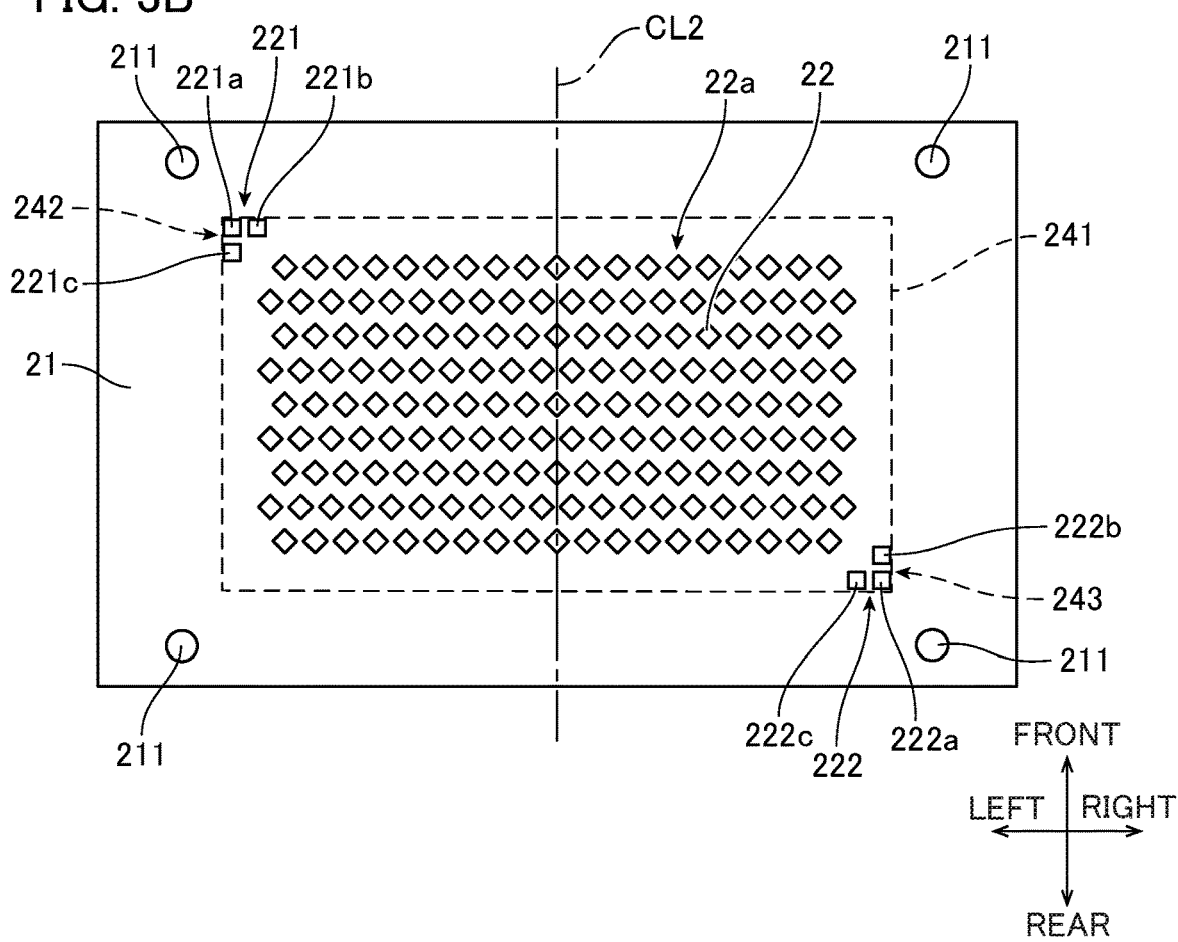

Next, the configuration of the fins 22 provided on the lower surface of the heat dissipation board 21 is described by referring to FIGS. 3A and 3B. FIGS. 3A and 3B are explanatory diagrams of the fins 22 provided on the heat dissipation board of the semiconductor apparatus 1 in accordance with embodiments. FIG. 3A indicates a perspective view with the lower surface of the heat dissipation board 21 facing upward. FIG. 3B indicates a plan view of the heat dissipation board 21 as seen from below. In FIG. 3B, the outline of the recess 24 with the heat dissipation board 21 attached to the cooling case 23 is indicated by a dashed line 241 for descriptive purposes.

The fins 22 are integral with the lower surface of the heat dissipation board 21. The fins 22 may be formed from the same metal material as the heat dissipation board 21. The fins 22 are used as a heat dissipation plate, i.e., a heat sink. For example, the fins 22 may be pin fins wherein a plurality of pins shaped like prisms (prismatic pins) are arranged to be spaced apart from each other with predetermined pitches, as depicted in FIGS. 3A and 3B. The configuration of the fins 22 provided on the heat dissipation board 21 is not limited to this and can be changed, as appropriate. For example, instead of the prism-shaped pins depicted in FIGS. 3A and 3B, cylindrical pins may be provided, or a plurality of blade-shaped fins extending in the front-rear direction may be arranged parallel to each other.

The shape and size of the fins 22 will preferably be set, as appropriate, in consideration of a condition under which a cooling medium is introduced into the cooler 20 (e.g., pump performance), the type and property of the cooling medium (viscosity or the like, among other things), target amount of heat removal, or the like. The fins 22 are formed to have a height such that when the fins 22 are accommodated within the cooling case 23 (more specifically, within the recess 24 in the cooling case 23), there is a certain clearance between the leading end portions of the fins 22 and the bottom wall 231 of the cooling case 23 (see FIG. 5).

When the insulated substrates 14 have been bonded to the heat dissipation board 21, a region on the heat dissipation board 21 within which the fins 22 are provided will preferably include a region on the opposite side (reverse side) from the regions on the insulated substrates 14 within which the semiconductor elements (IGBT elements 12 and freewheel diodes 13) are implemented. In other words, the region on the heat dissipation board 21 with which the fins 22 are integral will preferably include regions directly below the IGBT elements 12 and the freewheel diodes 13.

In embodiments, an aggregation 22a of a plurality of prism-shaped fins 22 is provided on the lower surface (heat dissipation surface) of the heat dissipation board 21. The aggregation 22a of fins 22 has an essentially rectangular-solid external shape. The aggregation 22a of fins 22 is not limited to a rectangular-solid external shape, and more preferably, the aggregation 22a may have a chamfered shape or varied shape. The longer length direction of the aggregation 22a of fins 22 matches the longer length direction of the cooling case 23 (recess 24). FIGS. 3A and 3B indicate, with reference to the longer length direction, a center line CL2 of the aggregation 22a of fins 22 having an essentially rectangular-solid shape. When the heat dissipation board 21 is attached to the cooling case 23, the center line CL2 matches the center line CL1 of the recess 24 with reference to the longer length direction (see FIG. 2B).

The lower surface (heat dissipation surface) of the heat dissipation board 21 is provided with engagement pieces 221 and 222 to be used for positioning and located in the vicinities of the aggregation 22a of fins 22. The engagement pieces 221 and 222 are integral with the lower surface of the heat dissipation board 21. The engagement pieces 221 and 222 may be formed from the same metal material as the heat dissipation board 21. The engagement piece 221 is located at a position corresponding to a front-left corner of the aggregation 22a of fins 22. The engagement piece 222 is located at a position corresponding to a rear-right corner of the aggregation 22a of fins 22. The engagement pieces 221 and 222 are each formed by arranging a plurality of (in embodiments, three) prism-shaped pins (prismatic pins).

As depicted in FIG. 3B, the engagement piece 221 includes a reference engagement piece 221a located at a position corresponding to a front-left corner of the heat dissipation board 21 and a pair of auxiliary engagement pieces 221b and 221c positioned rightward of and rearward of the reference engagement piece 221a. The reference engagement piece 221a and the auxiliary engagement pieces 221b and 221c may have the same shape. When seen in a plan view, the engagement piece 221 has a configuration in which two adjacent edges of each prism-shaped pin face forward and leftward with reference to the semiconductor apparatus 1.

As with the engagement piece 221, the engagement piece 222 includes a reference engagement piece 222a located at a position corresponding to a rear-right corner of the heat dissipation board 21 and a pair of auxiliary engagement pieces 222b and 222c positioned forward of and leftward of the reference engagement piece 222a. The reference engagement piece 222a and the auxiliary engagement pieces 222b and 222c may have the same shape. When seen in a plan view, the engagement piece 222 has a configuration in which two adjacent edges of each prism-shaped pin face rightward and rearward with reference to the semiconductor apparatus 1. The reference engagement piece 222a, the auxiliary engagement pieces 222b and 222c, the reference engagement piece 221a, and the auxiliary engagement pieces 221b and 221c may have the same shape.

The engagement pieces 221 and 222 are used for positioning when attaching the heat dissipation board 21 to the cooling case 23. When attaching the heat dissipation board 21 to the cooling case 23, the engagement pieces 221 and 222 engage portions of the inner wall surface in the recess 24 of the cooling case 23 and serves to position the heat dissipation board 21 with reference to the cooling case 23. The engagement pieces 221 and 222 respectively engage corners 242 and 243 of the inner wall surface in the recess 24 that are diagonally opposite from each other. More specifically, the engagement piece 221 engages the front-left corner 242 of the inner wall surface in the recess 24, and the engagement piece 222 engages the rear-right corner 243 of the inner wall surface in the recess 24.

The reference engagement pieces 221a and 222a form a pair of engagement pieces and respectively have external shapes corresponding to the shapes of the corners 242 and 243 in the recess 24. The reference engagement pieces 221a and 222a have a square cross-sectional shape, and right-angled portions of these pieces respectively engage the corners 242 and 243 in the recess 24. The auxiliary engagement pieces 221b and 221c and the auxiliary engagement pieces 222b and 222c respectively form auxiliary engagement pieces located in the vicinities of the reference engagement piece 221a and the reference engagement piece 222a and engage portions of the inner wall surface in the recess 24.

Referring to the lower surface of the heat dissipation board 21 (heat dissipation surface), the spacing between the reference engagement piece 221a and each of the auxiliary engagement pieces 221b and 221c is narrower than the spacings between the fins 22 forming the aggregation 22a of fins 22, thereby making the cooling medium introduced into the cooling case 23 less likely to enter the spaces between the reference engagement piece 221a and the auxiliary engagement pieces 221b and 221c, as will be described hereinafter in detail. This is also true for the spacings between the reference engagement piece 222a and the auxiliary engagement pieces 222b and 222c. Note that eliminating the spaces between the reference engagement piece 221a (222a) and the auxiliary engagement pieces 221b and 221c (222b and 222c) will be preferable in terms of heat resistance and reduction in deterioration pertaining to pressure loss.

The size of the engagement pieces 221 and 222 will preferably be set, as appropriate, in consideration of a condition under which a cooling medium is introduced into the cooler 23 (e.g., pump performance), the type and property of the cooling medium (viscosity or the like, among other things), or the like. For example, each of the engagement pieces forming the engagement pieces 221 and 222 may have a side length of 5 mm and a height of 3 to 5 mm. Setting the side length to 5 mm allows for appropriate contact with portions of the inner wall surface in the recess 24. Setting the height to 3 to 5 mm allows a clearance to be formed before the lower surface in the recess 24 so that the cooling medium can flow smoothly.

Figure 4:
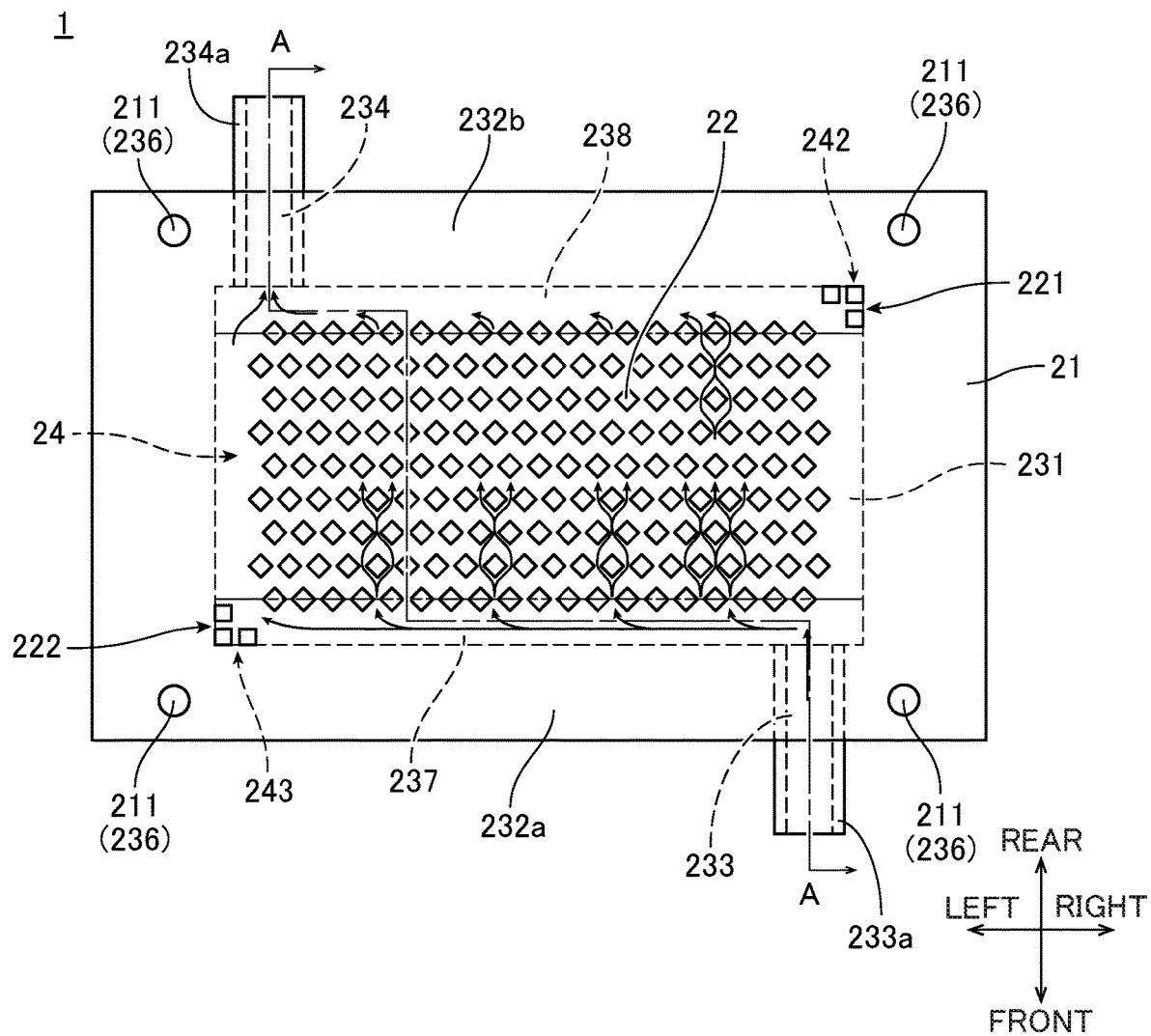
FIG. 4 is an explanatory diagram of flows of a cooling medium in a semiconductor apparatus in accordance with embodiments.
Figure 5:
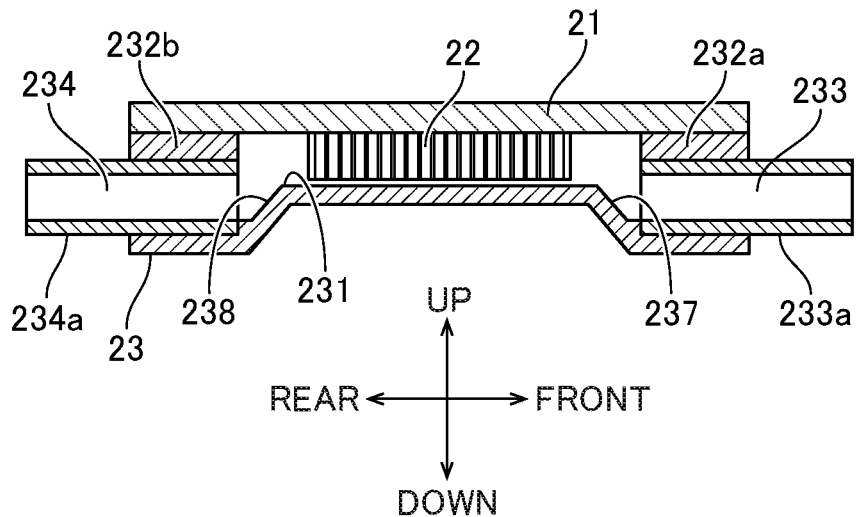
FIG. 5 is a cross-sectional view taken on line A-A depicted in FIG. 4.

FIG. 4 indicates a plan view for a situation in which the heat dissipation board 21 depicted in FIG. 1A has been attached to the cooling case 23 depicted in FIG. 1B. FIG. 5 indicates a cross-sectional view taken on line A-A of FIG. 4. Note that indication of components on the heat dissipation board 21 is omitted in FIGS. 4 and 5 so as to facilitate understanding of the present invention. For descriptive purposes, FIG. 4 illustrates the fins 22 and the engagement pieces 221 and 222 provided on the lower surface of the heat dissipation board 21 and also depicts flows of a cooling medium within the recess 24 by using arrows.

When attaching the heat dissipation board 21 to the cooling case 23, the engagement pieces 221 and 222 engage the inner wall surface in the recess 24, as depicted in FIG. 4. More specifically, the engagement piece 221 engages the corner 242 of the inner wall surface in the recess 24, and the engagement piece 222 engages the corner 243 of the inner wall surface in the recess 24. In this way, the heat dissipation board 21 is positioned with reference to the cooling case 23. Under this condition, screws (not illustrated) are inserted into the screw holes 236 of the cooling case 23 through the screw holes 211 of the heat dissipation board 21 so as to fasten the heat dissipation board 21 to the upper surface of the cooling case 23. A cooling medium is introduced into the cooling case 23 with the heat dissipation board 21 attached thereto in this manner.

As depicted in FIG. 5, the diffusion wall 237 is formed from a surface inclined upward from the bottom edge of the first side wall 232a toward the bottom wall 231. The convergence wall 238 is formed from a surface inclined downward from the bottom wall 231 toward the bottom edge of the second side wall 232b. Forming the diffusion wall 237 and the convergence wall 238 from inclined surfaces suppresses vortex flows that could occur if these walls were perpendicular to the introduction port 233 and/or the discharge port 234.

Owing to the diffusion wall 237 being provided within the cooling case 23, a cooling medium introduced through the introduction port 233 hits the diffusion wall 237 and is diffused along this wall in the longer length direction of the cooling case 23 (more specifically, the leftward direction depicted in FIG. 4). Then, the cooling medium flows in the shorter length direction of the cooling case 23 (more specifically, flows toward the rearward side depicted in FIG. 4) by passing through the spaces between the fins 22 facing the bottom wall 231, thereby attaining heat exchange with the heat sink. Finally, the cooling medium is converged by flowing along the convergence wall 238 and discharged through the discharge port 234 to the outside of the cooling case 23.

As described above, the lower surface (heat dissipation surface) of the heat dissipation board 21 in the semiconductor apparatus 1 is provided with the plurality of engagement pieces 221 and 222 for positioning which engage portions of the inner wall surface in the recess 24 of the cooling case 23. Thus, the heat dissipation board 21 can be positioned with reference to the cooling case 23 by using portions of the recess 24 for accommodating the fins 22. Accordingly, the heat dissipation board 21 can be positioned accurately with reference to the cooling case 23 without need for a complicated configuration.

In particular, the engagement pieces 221 and 222 include the pair of reference engagement pieces 221a and 222a to engage the corners 242 and 243 in the recess 24 that are diagonally opposite from each other. Hence, the heat dissipation board 21 can be positioned with reference to the cooling case 23 at the corners 242 and 243 in the recess 24 that are diagonally opposite from each other, thereby preventing misalignment with reference to the cooling case 23 effectively.

The reference engagement pieces 221a and 222a are respectively configured to engage the corners 242 and 243 which are located at positions spaced apart from the discharge port 234 and the introduction port 233 among the corners continuous with the second side wall 232b and the first side wall 232a (see FIG. 4). Accordingly, the heat dissipation board 21 can be positioned with reference to the cooling case 23 without decreasing the flow rate of a cooling medium introduced through the introduction port 233 or to be discharged through the discharge port 234.

In addition, the reference engagement pieces 221a and 222a respectively have external shapes corresponding to the shapes of the corners 242 and 243 continuous with the second side wall 232b and the first side wall 232a. Thus, the heat dissipation board 21 can be positioned with reference to the cooling case 23 efficiently by means of the shapes of the corners 242 and 243 of the recess 24. More specifically, the reference engagement pieces 221a and 222a have a square cross-sectional shape, and right-angled portions of these pieces engage the corners 242 and 243. The reference engagement pieces 221a and 222a engage the corners 242 and 243 by means of right-angled portions thereof so that the heat dissipation board 21 can be reliably positioned with reference to the cooling case 23.

The auxiliary engagement pieces 221b and 221c and the auxiliary engagement pieces 222b and 222c to engage portions of the inner wall surface in the recess 24 are respectively provided in the vicinities of the reference engagement pieces 221a and 222a. Accordingly, engagement with the inner wall surface in the recess 24 can be achieved using not only the reference engagement pieces 221a and 222a but also the plurality of engagement pieces, so that the heat dissipation board 21 can be positioned with reference to the cooling case 23 with strength ensured.

The spacing between the reference engagement piece 221a (222a) and each of the auxiliary engagement pieces 221b and 221c (222b and 222c) is narrower than the spacings between the fins 22 forming the aggregation 22a of fins 22, thereby making the cooling medium introduced into the cooling case 23 less likely to enter the spaces between the reference engagement piece 221a (222a) and the auxiliary engagement pieces 221b and 221c (222b and 222c). Accordingly, even though the engagement piece 221 (222) is provided, the influence of the engagement piece 221 (222) on the flow rate of the cooling medium introduced into the cooling case 23 can be decreased.

The engagement pieces 221 and 222 may be formed from the same metal material as the heat dissipation board 21. Thus, the engagement pieces 221 and 222 can be fabricated in the process of fabricating the heat dissipation board 21, and hence a particular process does not need to be added to form the engagement pieces 221 and 222. Accordingly, the engagement pieces 221 and 222 can be formed on the heat dissipation board in an existing fabrication process without adding a particular fabrication process.

In addition, the heat dissipation board 21 in the semiconductor apparatus 1 is fastened to the cooling case 23 by using screws (fastening members) with the engagement pieces 221 and 222 engaging portions of the inner wall surface in the recess 24. Thus, the heat dissipation board 21 can be fixed to the cooling case 23 in a positioned state, thereby preventing degradation of the cooling capability of the cooler 20 and failure in fastening which could be caused by misalignment of the heat dissipation board 21.

Figure 6:
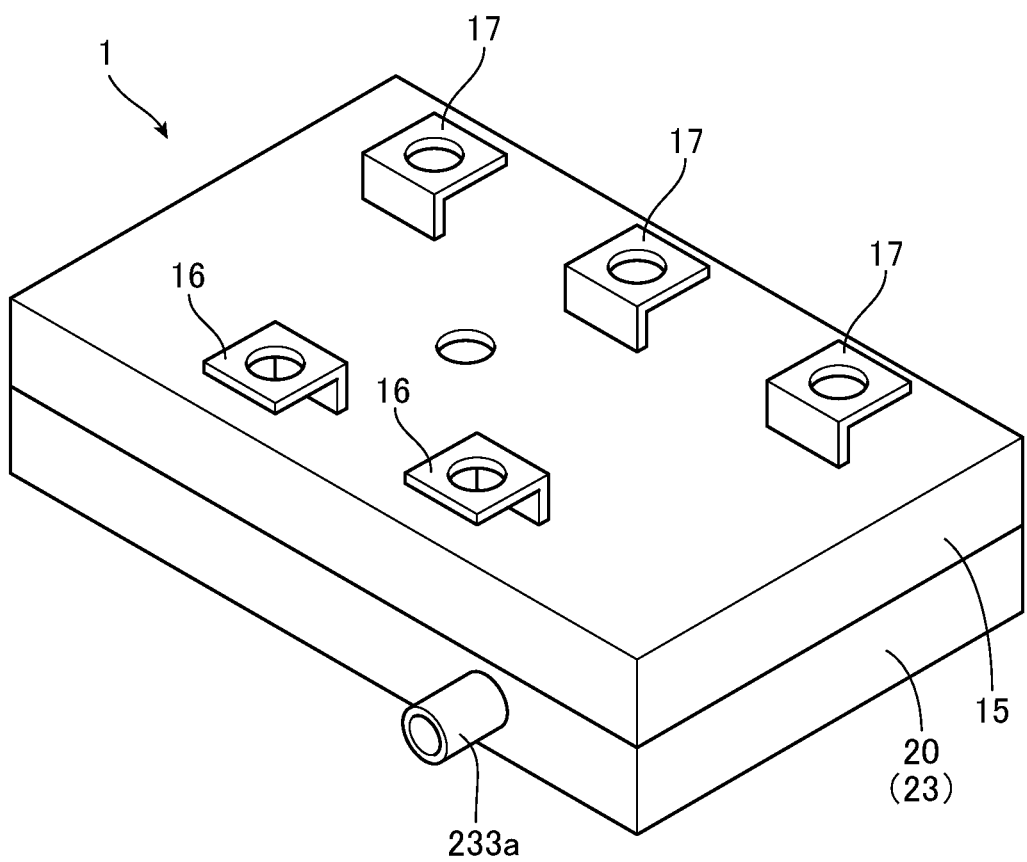
FIG. 6 is a perspective view of a semiconductor apparatus in accordance with embodiments with a resin case attached thereto.

FIG. 6 is a perspective view of the semiconductor apparatus 1 with a resin case 15 for accommodating the semiconductor module 10 having been attached to peripheral portions of the heat dissipation board 21 for forming the cooler 20. As depicted in FIG. 6, the resin case 15 has an essentially rectangular-solid external shape. When having been fixed to the heat dissipation board 21, the resin case 15 has sizes, as viewed from above, in the longer length direction and the shorter length direction which are essentially the same as those of the cooler 20 (cooling case 23).

P and N terminals 16 and U, V, and W terminals 17 connected to a circuit of the semiconductor module 10 protrude from an upper surface of the resin case 15. The P and N terminals 16 and the U, V, and W terminals 17 are arranged in the longer length direction of the cooling case 23. At least either the terminals 16 or the terminals 17 can be arranged in the shorter length direction of the cooling case 23. However, when a plurality of IGBT elements 12 and freewheel diodes 13 are, as depicted in FIGS. 1A and 1B, arranged as circuit element parts 11A, 11B, and 11C in parallel in the longer length direction of the heat dissipation board 21, the terminals 16 and 17 can be arranged in the longer length direction of the cooling case 23 so as to reduce the inductance between the terminals 16 and 17 and the IGBT elements 12 and freewheel diodes 13 in comparison to when the terminals 16 and 17 are arranged in the shorter length direction. Owing to the arranging of the terminals 16 and 17 in the longer length direction of the cooling case 23, the plurality of circuit element parts 11A, 11B, and 11C provided with the plurality of IGBT elements 12 to be connected to these terminals can be positioned close to each other. Accordingly, the fins 22 for dissipating heat from the circuit element parts 11A, 11B, and 11C can be formed as a single aggregation, thereby facilitating the fabrication of the fins 22 and decreasing the cost of fabrication thereof.

The present invention is not limited to the embodiments described above and can be implemented with various changes made thereto. The above-described embodiments are not limited to the sizes, shapes, functions, or the like of the components illustrated in the attached drawings and can have changes made thereto, as appropriate, as long as the effect of the invention can be achieved. In addition, the invention can be implemented with changes made thereto, as appropriate, without deviating from the scope of the purpose of the invention.

The above-indicated embodiments have been described by referring to the example in which the recess 24 provided in the cooling case 23 has an essentially rectangular shape. However, the shape of the recess 24 is not limited to this and can be changed, as appropriate. For example, the recess 24 may have a quadrangular shape such as a square shape.

The above-indicated embodiments have been described by referring to the situation in which the engagement pieces 221 and 222 provided on the heat dissipation board 21 respectively engage the corners 242 and 243 in the recess 24 diagonally opposite from each other. However, the configuration of the engagement pieces to engage the inner wall surface in the recess 24 is not limited to this and can be changed, as appropriate. For example, an engagement piece to engage a corner other than the corners 242 and 243 may be further provided. In this case, however, the position of the introduction port 233 or the discharge port 234 needs to be changed, as appropriate. Meanwhile, as long as the engagement pieces 221 and 222 engage portions of the inner wall surface in the recess 24, these pieces may be configured to engage portions other than the corners 242 and 243.

The above-indicated embodiments have been described by referring to the situation in which the engagement pieces 221 and 222 provided on the lower surface of the heat dissipation board 21 (heat dissipation surface) are each formed from a plurality of engagement pieces. However, the configuration of the engagement pieces 221 and 222 is not limited to this and can be changed, as appropriate. For example, the engagement pieces 221 and 222 may each be formed from a single engagement piece having a cross section shaped like a square or a right-angled triangle.

When applying single engagement pieces having a cross section shaped like a right-angled triangle, right-angled portions will preferably engage the corners 242 and 243 of the recess 24. In this case, the area of contact between the engagement pieces and a cooling medium introduced into the cooling case 23 can be reduced. Thus, the influence of the engagement pieces on the flow rate of the cooling medium introduced into the cooling case 23 can be further decreased.

The following are an overview of features in the embodiments described above.

The semiconductor apparatus in accordance with the embodiments described above includes an insulated substrate that includes a first surface and a second surface on an opposite side from the first surface, a semiconductor element that is mounted on the first surface of the insulated substrate, and a cooler for cooling the semiconductor element, wherein the cooler includes: a heat dissipation board having a bonding surface and a heat dissipation surface on an opposite side from the bonding surface, the bonding surface being bonded to the second surface of the insulated substrate; a plurality of fins provided on the heat dissipation surface of the heat dissipation board; and a cooling case having a recess accommodating the plurality of fins, and wherein the heat dissipation surface is provided with a plurality of engagement pieces for positioning that engage portions of an inner wall surface in the recess of the cooling case. In this configuration, the heat dissipation surface of the heat dissipation board is provided with engagement pieces for positioning that engage portions of the inner wall surface in the recess of the cooling case, so that the heat dissipation board can be positioned with reference to the cooling case by using portions of the recess for accommodating the fins. Accordingly, the heat dissipation board can be positioned accurately with reference to the cooling case without need for a complicated configuration.

The semiconductor apparatus in accordance with the embodiments described above is such that when the semiconductor apparatus is seen in a plan view, the plurality of fins are provided within an essentially rectangular region on the heat dissipation surface, the recess of the cooling case has an essentially rectangular shape, and the plurality of engagement pieces include a pair of engagement pieces engaging corners in the recess that are diagonally opposite from each other. In this configuration, the plurality of engagement pieces include a pair of engagement pieces engaging corners in the recess that are diagonally opposite from each other, so that the heat dissipation board can be positioned with reference to the cooling case at the corners in the recess that are diagonally opposite from each other, thereby preventing misalignment with reference to the cooling case effectively.

The semiconductor apparatus in accordance with the embodiments described above is such that the cooling case includes a plurality of side walls defining the recess, and a pair of first and second side walls among the plurality of side walls that are provided in a longer length direction of an aggregation of the fins are provided with an introduction port and a discharge port for a cooling medium that are located at positions spaced apart in opposite directions from a center line of the recess with reference to a longer length direction of the recess, and the pair of engagement pieces engage corners of the recess that are located at positions spaced apart from the introduction port and the discharge port among corners continuous with the first and second side walls. In this configuration, the pair of engagement pieces engage corners located at positions spaced apart from the introduction port and the discharge port among the corners continuous with the first and second side walls, so that the heat dissipation board can be positioned with reference to the cooling case without decreasing the flow rate of a cooling medium introduced through the introduction port or to be discharged through the discharge port.

The semiconductor apparatus in accordance with the embodiments described above is such that the pair of engagement pieces have external shapes corresponding to shapes of corners in the recess that are diagonally opposite from each other. In this configuration, the positioning is achieved using the pair of engagement pieces having cross-sectional shapes corresponding to the shapes of the corners in the recess that are diagonally opposite from each other, so that the heat dissipation board can be reliably positioned with reference to the cooling case by means of the shapes of the corners of the recess.

The semiconductor apparatus in accordance with the embodiments described above is such that the pair of engagement pieces have a cross section shaped like a square or a right-angled triangle, and right-angled portions thereof engage corners continuous with the first and second side walls. In this configuration, right-angled portions of the pair of engagement pieces engage corners continuous with the first and second side walls, so that the heat dissipation board can be reliably positioned with reference to the cooling case.

The semiconductor apparatus in accordance with the embodiments described above is such that auxiliary engagement pieces engaging portions of the inner wall surface in the recess are provided in vicinities of the pair of engagement pieces. In this configuration, auxiliary engagement pieces engaging portions of the inner wall surface in the recess are provided in the vicinities of the pair of engagement pieces, and hence the engagement with the inner wall surface in the recess can be achieved using not only the pair of engagement pieces but also the plurality of engagement pieces, so that the heat dissipation board can be positioned with reference to the cooling case with strength ensured.

The semiconductor apparatus in accordance with the embodiments described above is such that spacings between the pair of engagement pieces and the auxiliary engagement pieces are narrower than spacings between the fins forming the aggregation of fins. In this configuration, the spacings between the pair of engagement pieces and the auxiliary engagement pieces are narrower than the spacings between the fins forming the aggregation of fins, thereby making the cooling medium less likely to enter the spaces between the pair of engagement pieces and the auxiliary engagement pieces. Thus, the influence of the pair of engagement pieces and the like on the flow rate of the cooling medium can be decreased.

The semiconductor apparatus in accordance with the embodiments described above is such that the plurality of engagement pieces are formed from a same metal material as the heat dissipation board. In this configuration, the plurality of engagement pieces are formed from the same metal material as the heat dissipation board. Thus, the engagement pieces can be fabricated in the process of fabricating the heat dissipation board, and hence a particular process does not need to be added to form the engagement pieces. Accordingly, the plurality of engagement pieces can be formed on the heat dissipation board in an existing fabrication process without adding a particular fabrication process.

The semiconductor apparatus in accordance with the embodiments described above is such that the heat dissipation board is fastened to the cooling case by using fastening members with the plurality of engagement pieces engaging portions of the inner wall surface in the recess. In this configuration, the heat dissipation board is fastened to the cooling case with the plurality of engagement pieces engaging portions of the inner wall surface in the recess. Hence, the heat dissipation board can be fixed to the cooling case in a positioned state, thereby preventing degradation of the cooling capability of the cooler and failure in fastening which could be caused by misalignment of the heat dissipation board.

INDUSTRIAL APPLICABILITY

The semiconductor apparatus of the present invention has the effect of allowing the heat dissipation board to be positioned accurately with reference to the cooling case without need for a complicated configuration and is preferable as a semiconductor apparatus required to be downsized or to output high power, such as a vehicle-mounted-motor drive control inverter.

The present application is based upon Japanese Patent Application No. 2018-188532, filed on Oct. 3, 2018, the entire contents of which are incorporated herein.

The invention claimed is:

1. A semiconductor apparatus, comprising:
an insulated substrate having a first surface and a second surface that are opposite to each other; and
a semiconductor element that is mounted on the first surface of the insulated substrate;
a cooler for cooling the semiconductor element, the cooler including
a heat dissipation board having a bonding surface and a heat dissipation surface that are opposite to each other, the bonding surface being bonded to the second surface of the insulated substrate,
a plurality of fins provided on the heat dissipation surface of the heat dissipation board, and
a cooling case having a recess accommodating the plurality of fins, an inner wall surface of the cooling case being in the recess, wherein
the recess of the cooling case has a substantially rectangular shape;
the heat dissipation surface is provided with a plurality of engagement pieces that position the cooling case by engaging portions of the inner wall surface of the cooling case;
the plurality of engagement pieces include a pair of reference engagement pieces, which engage portions of the inner wall surface of the cooling case respectively at two corners of the substantially rectangular shape that are diagonally opposite from each other; and
in both a first view that is in a first direction in parallel to longer sides of the substantially rectangular shape, and a second view that is in a second direction in parallel to shorter side of the substantially rectangular shape, each of the reference engagement pieces is free of overlapping with any of the plurality of fins.

2. The semiconductor apparatus of claim 1, wherein, in a plan view of the semiconductor apparatus,
the plurality of fins are provided within a substantially rectangular region on the heat dissipation surface.

3. The semiconductor apparatus of claim 2, wherein
the cooling case includes a plurality of side walls defining the recess, including a first side wall and a second side wall that are respectively at the two longer sides of the substantially rectangular shape,
the first side wall and the second side wall have an introduction port and a discharge port formed respectively thereon for a cooling medium, the introduction port and the discharge port being spaced apart in opposite directions with respect to a center axis of the substantially rectangular shape that is perpendicular to the two longer sides thereof, and
the corners engaged by the pair of reference engagement pieces are farther from the introduction port and the discharge port than other corners of the substantially rectangular shape.

4. The semiconductor apparatus of claim 2, wherein
the pair of reference engagement pieces have external shapes corresponding to shapes of said corners.

5. The semiconductor apparatus of claim 4, wherein
a cross section of each of the reference engagement pieces is of a shape of a square or a right-angled triangle, a right-angled portion thereof engaging one of the corners.

6. The semiconductor apparatus of claim 2, wherein
the plurality of engagement pieces further include a plurality of auxiliary engagement pieces in vicinities of the pair of reference engagement pieces.

7. The semiconductor apparatus of claim 6, wherein
spacing between the reference engagement pieces and the auxiliary engagement pieces are narrower than spacing between the fins.

8. The semiconductor apparatus of claim 1, wherein
the plurality of engagement pieces and the heat dissipation board are formed of a same metal material.

9. The semiconductor apparatus of claim 1, wherein
the heat dissipation board is fastened to the cooling case by fastening the plurality of engagement pieces to the portions of the inner wall surface in the recess.

* * * * *